United States Patent
Xu et al.

(10) Patent No.: US 11,749,591 B1
(45) Date of Patent: Sep. 5, 2023

(54) POWER CONVERTER PACKAGE WITH THERMALLY ENHANCED INTERPOSERS TO COOLING FINS

(71) Applicant: Hong Kong Applied Science and Technology Research Institute Company Limited, Hong Kong (HK)

(72) Inventors: Danting Xu, Hong Kong (HK); Kun Wu, Shenzhen (CN); Ziyang Gao, Hong Kong (HK)

(73) Assignee: Hong Kong Applied Science and Technology Research Institute Company Limited, Hong Kong (HK)

( * ) Notice: Subject to any disclaimer, the term of this patent is extended or adjusted under 35 U.S.C. 154(b) by 0 days.

(21) Appl. No.: 17/676,960

(22) Filed: Feb. 22, 2022

(51) Int. Cl.
*H01L 23/66* (2006.01)
*H01L 23/498* (2006.01)
*H01L 23/367* (2006.01)
*H05K 7/14* (2006.01)
*H02M 1/00* (2006.01)

(52) U.S. Cl.
CPC ...... *H01L 23/49827* (2013.01); *H01L 23/367* (2013.01); *H01L 23/49816* (2013.01); *H05K 7/1432* (2013.01); *H01L 2924/15311* (2013.01); *H02M 1/00* (2013.01); *H05K 2201/10378* (2013.01)

(58) Field of Classification Search
None
See application file for complete search history.

(56) References Cited

U.S. PATENT DOCUMENTS

| | | | |
|---|---|---|---|
| 6,154,364 A | 11/2000 | Girrens et al. | |
| 6,712,621 B2 | 3/2004 | Li et al. | |
| 9,105,598 B2 | 8/2015 | Stella et al. | |
| 10,993,325 B2 | 4/2021 | Trelford et al. | |
| 2008/0112139 A1 | 5/2008 | Vinciarelli et al. | |
| 2021/0183725 A1 | 6/2021 | Vincent et al. | |

FOREIGN PATENT DOCUMENTS

| | | |
|---|---|---|
| CN | 101273453 A | 9/2008 |
| CN | 109640521 A | 4/2019 |

OTHER PUBLICATIONS

ISR and Written Opinion, PCT/CN2022/078701, dated Oct. 31, 2022.

*Primary Examiner* — Long Pham
(74) *Attorney, Agent, or Firm* — Stuart T. Auvinen; g Patent LLC

(57) ABSTRACT

A power-converter module has a switching Printed Circuit Board (PCB) with power transistors that generate heat. Ground, an input power supply, and an output power supply to the power transistors connect through metal traces on the switching PCB directly to interposer heat sinks that are soldered between the switching PCB and a system PCB. The metal traces and interposer heat sinks carry both supply or ground currents and heat away from the power transistors. These power and ground currents continue from the interposer heat sinks to the system PCB through direct solder joints between the system PCB and the interposer heat sinks. An interposer PCB has a same thickness as the interposer heat sinks and carries control signals from the system PCB to the switching PCB, bypassing the interposer heat sinks. The interposer heat sinks have an interposer portion soldered between the PCBs and fins beyond the switching PCB footprint.

20 Claims, 11 Drawing Sheets

US 11,749,591 B1

POWER CONVERTER PACKAGE WITH THERMALLY ENHANCED INTERPOSERS TO COOLING FINS

FIELD OF THE INVENTION

This invention relates to electronic modules, and more particularly for Switched-Mode Power Supply (SMPS) modules with heat sinks in the electrical conducting paths.

BACKGROUND OF THE INVENTION

Power converters are widely used to convert one power-supply voltage to another. A Switched-Mode Power Supply (SMPS) has transistors that are rapidly switched on and off to allow current to flow from an input supply voltage terminal to an output supply inductor and capacitor that can filter power to a load.

FIG. 1 shows a prior-art Switched-Mode Power Supply (SMPS). An input supply voltage VIN+ is to be converted to an output supply voltage VOUT+. a common ground GND is used for both input and outputs, but some systems have separate grounds.

Input capacitor 320 between VIN+ and GND filters the input to the drains of pull-up transistors 302, 306, while ground is connected to the sources of pull-down transistors 304, 308. The source of pull-up transistor 302 and the drain of pull-down transistor 304 are connected together to drive VOUT+ through inductor 312 to charge output capacitor 330.

The gate G1 of pull-up transistor 302 is driven high to turn on transistor 302 for a period of time to charge output capacitor 330. Once G1 is driven low, the gate of pull-down transistor 304 is driven high to discharge output capacitor 330. The signals for G1, G2 are typically clocks in the kHz frequency range, and the duty cycles are adjusted to obtain the desired output voltage VOUT+ for a particular input voltage VIN+. For example, by increasing the high time (duty cycle) for G1 relative to that of G2, a higher VOUT+ may be obtained.

Similarly, the source of pull-up transistor 306 and the drain of pull-down transistor 308 are connected together to drive VOUT+ through inductor 314 to charge output capacitor 330. The switching signals applied to the gates of transistors 306, 308 can be 180 degrees out-of-phase with the switching signals driving the gates of transistors 302, 304 for reduced output ripple.

Transistors 302, 304, 306, 308 could be n-channel Metal-Oxide-Semiconductor Field-Effect Transistors (MOSFET), but more recently Gallium-Nitride (GaN) transistors are being used since they can supply a much higher current for a given physical transistor size. GaN transistors have allowed for higher density power-converter modules, since a higher power current can be provided using GaN devices for a given power-converter module or package size.

One downside to higher density power-converter modules is that the very high power currents generate a lot of heat. Thermal performance of the power-converter module and its packaging becomes very important. The high currents through GaN transistors 302, 304, 306, 308 generate heat that must be quickly conducted away and dissipated or hot spots can develop. These hot spots can damage the GaN transistors or even melt solder joints within the module.

Traditionally, heat sinks were attached directly to the tops of packages of switching transistors or other Integrated Circuits (ICs) that generate heat. A fan could provide better airflow to dissipate the heat from the heat sinks.

Unfortunately, the transistor packages are often made of materials that are poor heat conductors, such as plastic or ceramics. Heat may also be conducted through the package leads, pins, or solder balls on the bottom of the package that electrically connect the package transistors to an external system, such as traces on a Printed Circuit Board (PCB) that the package is mounted to. Heat may then be distributed through the PCB, which usually has a much larger surface area than the power-converter module. However, the PCB contains materials such as fiberglass that are thermally insulating, so the amount of heat that a PCB can dissipate may be limited.

When the power-converter has an array of solder balls to the system PCB, heat may be safely transferred through the Ball-Grid-Array (BGA). However, when the solder-ball array is not sufficiently large, or when non-BGA packages are used, more heat is transferred through fewer package leads. Then the solder joints for these fewer leads may become hotspots that heat to the point of melting or damaging these solder joints. The thermally-insulating materials in the PCB may prevent this heat from dissipating away from these solder joints at a high enough rate, causing localized hot spots and potential damage. The PCB is much less efficient at dissipating heat than a metal heat sink.

What is desired is a power-converter module with a heat sink integrated into the electrical signal paths between the power-convert transistors and the system PCB. It is desired to intercept heat that flows through the electrical paths to the system PCB and efficiently dissipate this heat using a metal heat sink. Rather than attach the heat sink to the package top, it is desired to solder several heat sinks to the package's electrical interconnect, and then connect these heat sinks to the system PCB to make electrical connection through the heat sinks.

DETAILED DESCRIPTION

The present invention relates to an improvement in power modules. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
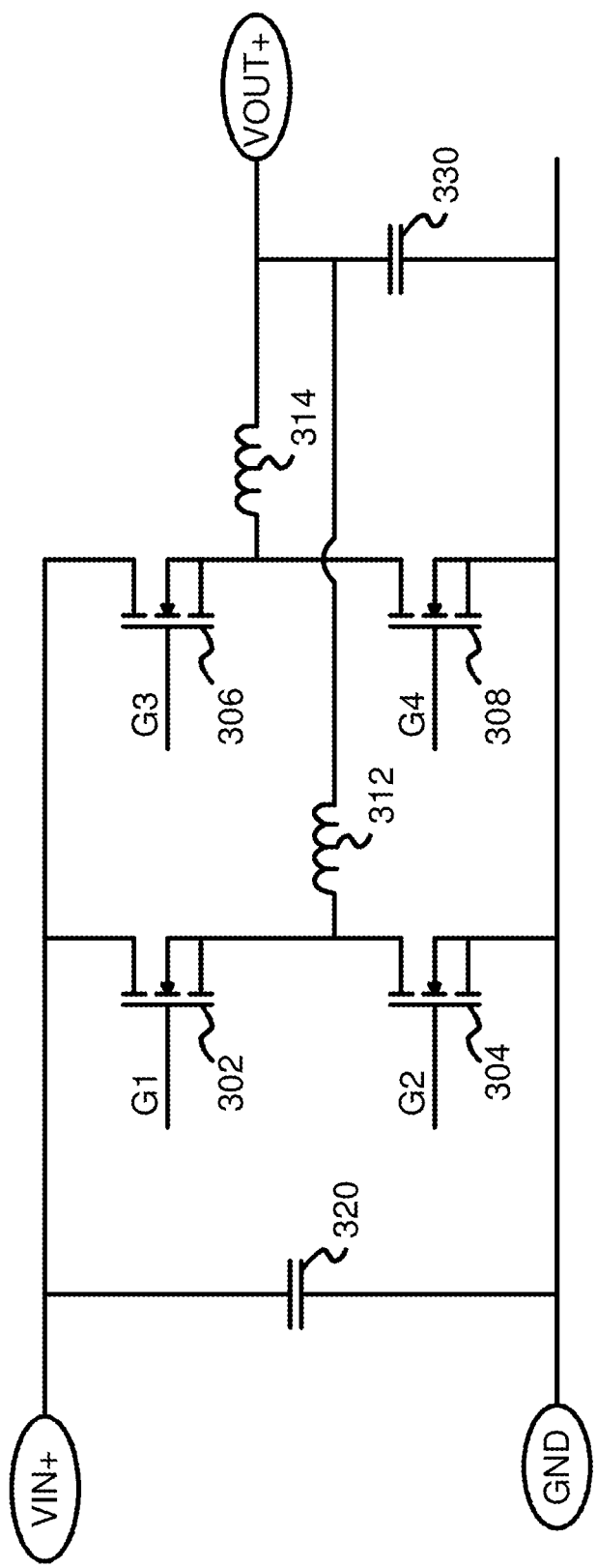
FIG. 1 shows a prior-art Switched-Mode Power Supply (SMPS).
Figure 2:
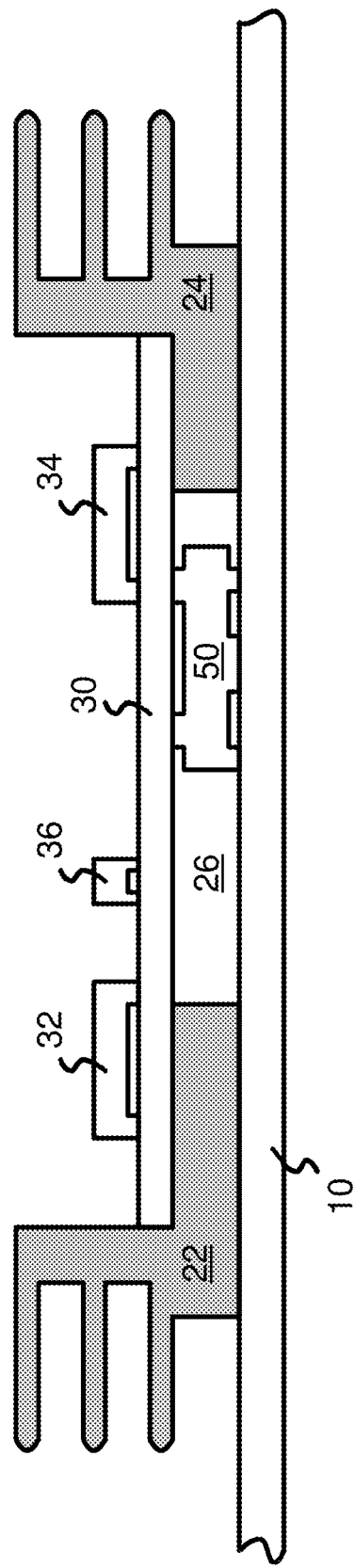
FIG. 2 shows a side view of a power-converter module with interposer heat sinks that conduct both heat and electrical signals to a system board.

FIG. 2 shows a side view of a power-converter module with interposer heat sinks that conduct both heat and electrical signals to a system board. Switching PCB 30 is a circuit board with wiring traces that connect to Integrated Circuit (IC) packages 32, 34 that are mounted on its top surface. For example, IC packages 32, 34 can contain GaN switching transistors such as one or more of transistors 302, 304, 306, 308 of FIG. 1. Other devices such as capacitors or inductors can be mounted to the top or bottom of switching PCB 30, such as capacitor 36.

Switching PCB 30 is not directly mounted to system PCB 10. Instead, metal trace pad on the bottom of switching PCB 30 are soldered to interposer heat sinks 22, 24. The bottom of interposer heat sink 22 is soldered to metal trace pads on the top surface of system PCB, while the bottom of interposer heat sink 24 is soldered to other metal trace pads on the top surface of system PCB. For example, interposer heat sink 22 could connect to ground traces on system PCB 10, while interposer heat sink 24 connect to VIN+ supply traces on system PCB 10. Another interposer heat sink (not shown) that is behind interposer heat sink 24 could connect to VOUT+ supply traces on system PCB 10.

Some control signals switch rapidly, such as to gates G1-G4 of transistors 302-308 (FIG. 1). These control signals are sensitive to large capacitive loads such as from interposer heat sinks 22, 24. Such control signals are not connected to any interposer heat sink, but instead are connected to system PCB 10 through interposer PCB 50. Interposer PCB 50 has metal traces and vias that make an electrical connection from metal pads on the bottom surface of switching PCB 30 to metal pads on the top surface of system PCB 10, for various control signals.

The capacitance added to these control signals by interposer PCB 50 is much less than that added to the power and ground signals VIN+, VOUT+, GND that pass through interposer heat sinks 22, 24. Since power supply and ground signals already have large capacitances such as from input capacitor 320 and output capacitor 330 (FIG. 1), the additional capacitance from interposer heat sinks 22, 24 is not problematic.

Interposer PCB 50 is located in cavity 26 between interposer heat sinks 22, 24. Interposer PCB 50 has about the same thickness as interposer heat sinks 22, 24.

Figure 3:
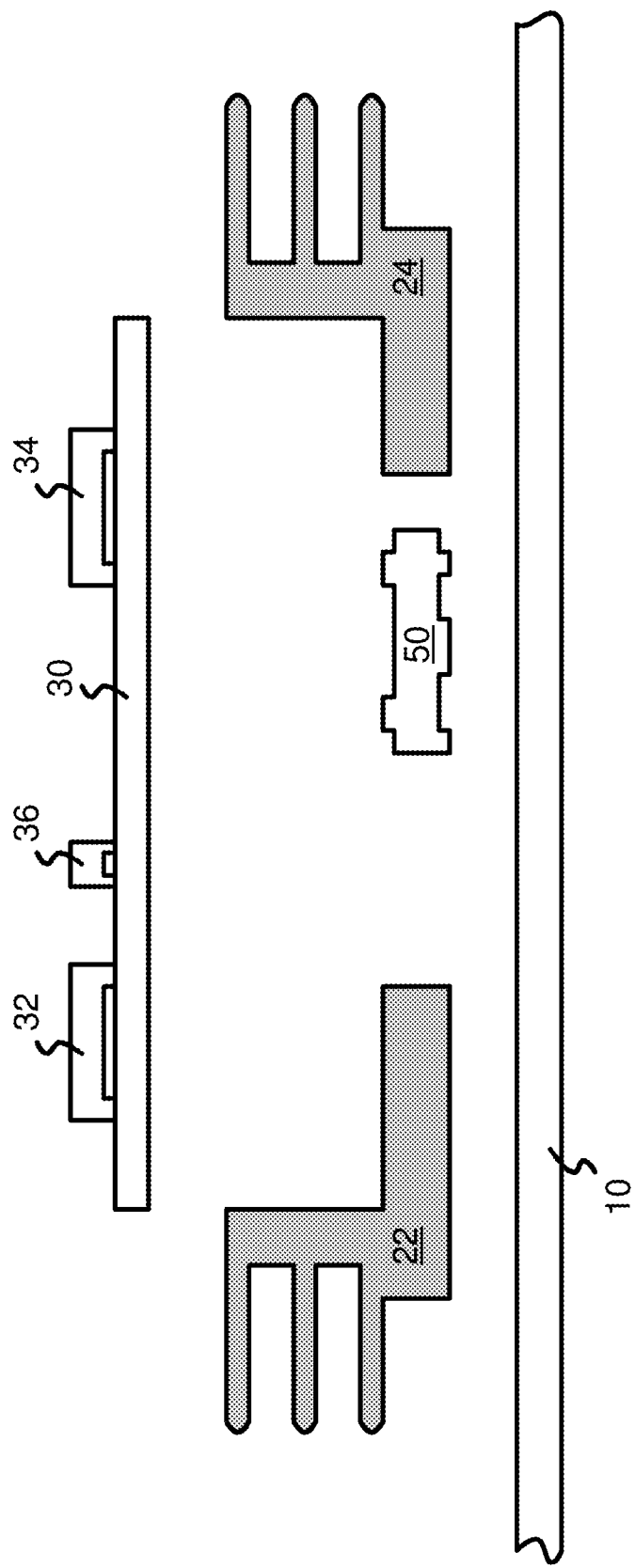
FIG. 3 is an exploded view of the components of the power-converter module with interposer heat sinks.

FIG. 3 is an exploded view of the components of the power-converter module with interposer heat sinks. Switching PCB 30 has IC packages 32, 34 and capacitor 36 mounted thereon to form a sub-assembly. Such IC mounting to form the sub-assembly can be performed before interposer heat sinks 22, 24 and interposer PCB 50 are attached to the underside of switching PCB 30. Once interposer heat sinks 22, 24 and interposer PCB 50 are soldered to the underside of the sub-assembly of switching PCB 30, then this enhanced sub-assembly may be soldered to the top side of system PCB 10.

Figure 4:
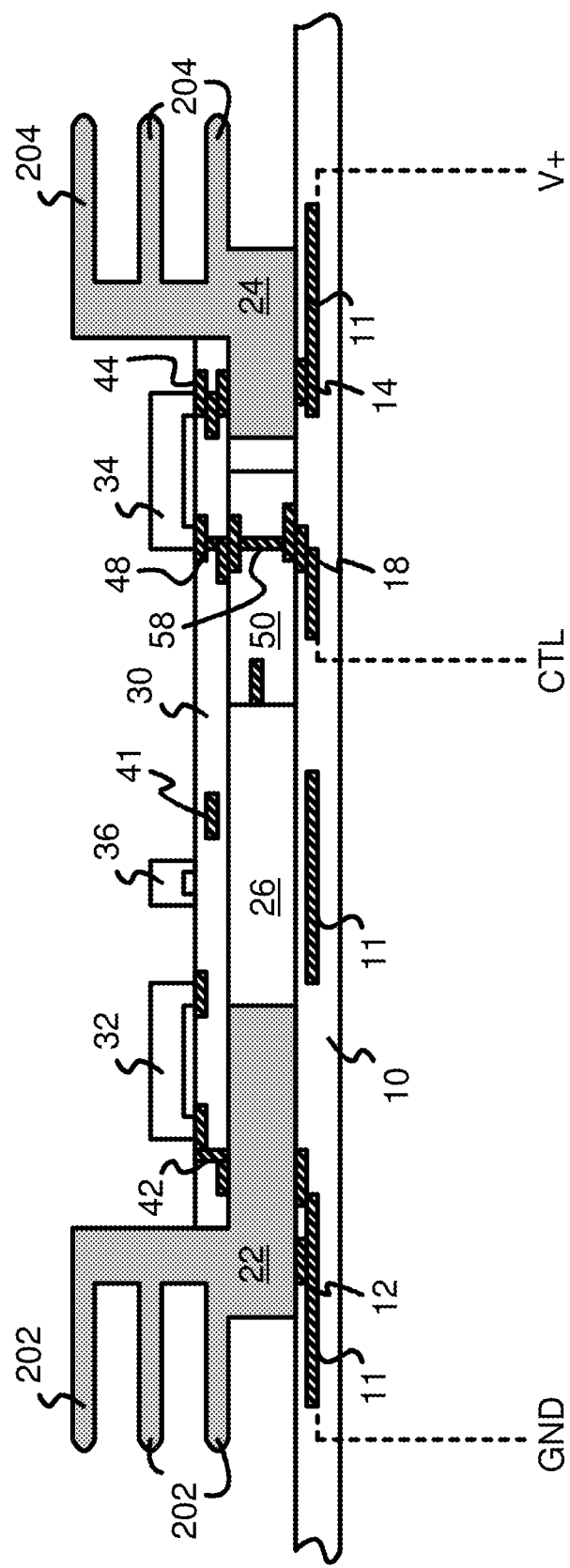
FIG. 4 is a cross-sectional view of the power-converter module with interposer heat sinks highlighting the metal PCB traces.

FIG. 4 is a cross-sectional view of the power-converter module with interposer heat sinks highlighting the metal PCB traces. Switching PCB 30 has several metal layers 41 that are patterned into traces. The traces on one metal layer may be connected by metal vias to traces on other metal layers to make interconnect that can pass from metal pads on the top metal layer to metal pads formed on the bottom metal layer of the PCB. System PCB 10 also has metal layers 11 that are patterned into traces that may connect to traces on other metal layers through metalized vias.

IC package 32 has a GaN transistor such as pull-down transistor 304 (FIG. 1) that generates heat when switching high currents. The ground terminal of this transistor connects to a lead on the bottom of IC package 32 that is soldered to a metal pad formed on the top surface of switching PCB 30. Interconnect 42 is formed from a metal pad on the top surface of switching PCB 30 and a metal pad on the bottom surface of switching PCB 30, and possibly traces on other metal layers interior to switching PCB 30, along with metal vias between layers. Interconnect 42 is a metal pathway from the soldered ground lead of IC package 32 to interposer heat sink 22. The bottom of interposer heat sink 22 is soldered to a metal pad on the top surface of system PCB 10, that connects to other metal layers within system PCB 10 by metalized vias to form interconnect 12, which is connected to a system ground.

Ground return current from the GaN transistor in IC package 32 is routed through interconnect 42, through the metal of interposer heat sink 22, to interconnect 12, and then to the ground connected to system PCB 10. Heat generated by this GaN transistor in IC package 32 is also conducted along the metal pathway of interconnect 42 through switching PCB 30 to interposer heat sink 22, where fins 202 provide a large surface area to dissipate this heat. Thus both electronic current and heat are carried away from IC package 32 by interconnect 42. Fins 202 cause interposer heat sink 22, interconnect 42, and interconnect 12 to have a cooler temperature than interconnect 42 and interconnect 12 would have if directly connected together without interposer heat sink 22. Interposer heat sink 22 may be constructed from a highly conductive metal such as copper or aluminum that conducts both heat and electricity efficiently.

IC package 34 has a GaN transistor such as pull-up transistor 302 (FIG. 1) that generates heat when switching high currents. The power terminal (VIN+ FIG. 1) of this transistor connects to a lead on the bottom of IC package 34 that is soldered to a metal pad formed on the top surface of switching PCB 30. Interconnect 44 is formed from a metal pad on the top surface of switching PCB 30 and a metal pad on the bottom surface of switching PCB 30, and possibly traces on other metal layers interior to switching PCB 30, along with metal vias between layers. Interconnect 44 is a metal pathway from the soldered VIN+ power lead of IC package 34 to interposer heat sink 24. The bottom of interposer heat sink 24 is soldered to a metal pad on the top surface of system PCB 10, that connects to other metal layers within system PCB 10 by metalized vias to form interconnect 14, which is connected to the input power supply voltage VIN+ that is connected to system PCB 10.

Input power current to the GaN transistor in IC package 34 is routed through interconnect 44, through the metal of interposer heat sink 24, to interconnect 14, and then to the VIN+ input power connected to system PCB 10. Heat generated by this GaN transistor in IC package 34 is also conducted along the metal pathway of interconnect 44 through switching PCB 30 to interposer heat sink 24, where fins 204 provide a large surface area to dissipate this heat. Thus both electronic current to and heat from IC package 34 are carried by interconnect 44. Fins 204 cause interposer heat sink 24, interconnect 44, and interconnect 14 to have a cooler temperature than interconnect 44 and interconnect 14 would have if directly connected together without interposer heat sink 24.

Other transistor terminals such as gate G1 carry control signals. For example, gate G1 of pull-up transistor 302 in IC package 34 connects to interconnect 48 to pass through switching PCB 30 to interposer PCB 50. Interconnect 58 is formed from patterned metal traces on several layers and vias between them in interposer PCB 50. A metal pad on the bottom of interposer PCB 50 is soldered to a metal pad on the top of system PCB 10 to connect to interconnect 18 that connects to the control signal generated by other circuitry on system PCB 10 or on another daughter board connected to system PCB 10. Thus an electrical path is made for control signals such as gate control G1 from system PCB 10, through interconnect 18 to interconnect 58 through interposer PCB 50 to interconnect 48 through switching PCB 30 to IC package 34. Although heat is also carried by interconnect 58, interposer heat sink 24 provides enough cooling through interconnect 44 to cool IC package 34 so that interconnect 58 is not too hot.

Both heat and electronic current flow through interconnect 42, 44. Heat is dissipated by fins 202 in interposer heat sink 22, while electrical current to ground flows through interposer heat sink 22. Heat is dissipated by fins 204 in interposer heat sink 24, while electrical current from the input power supply V+(VIN+ FIG. 1) flows through interposer heat sink 24.

Figure 5:
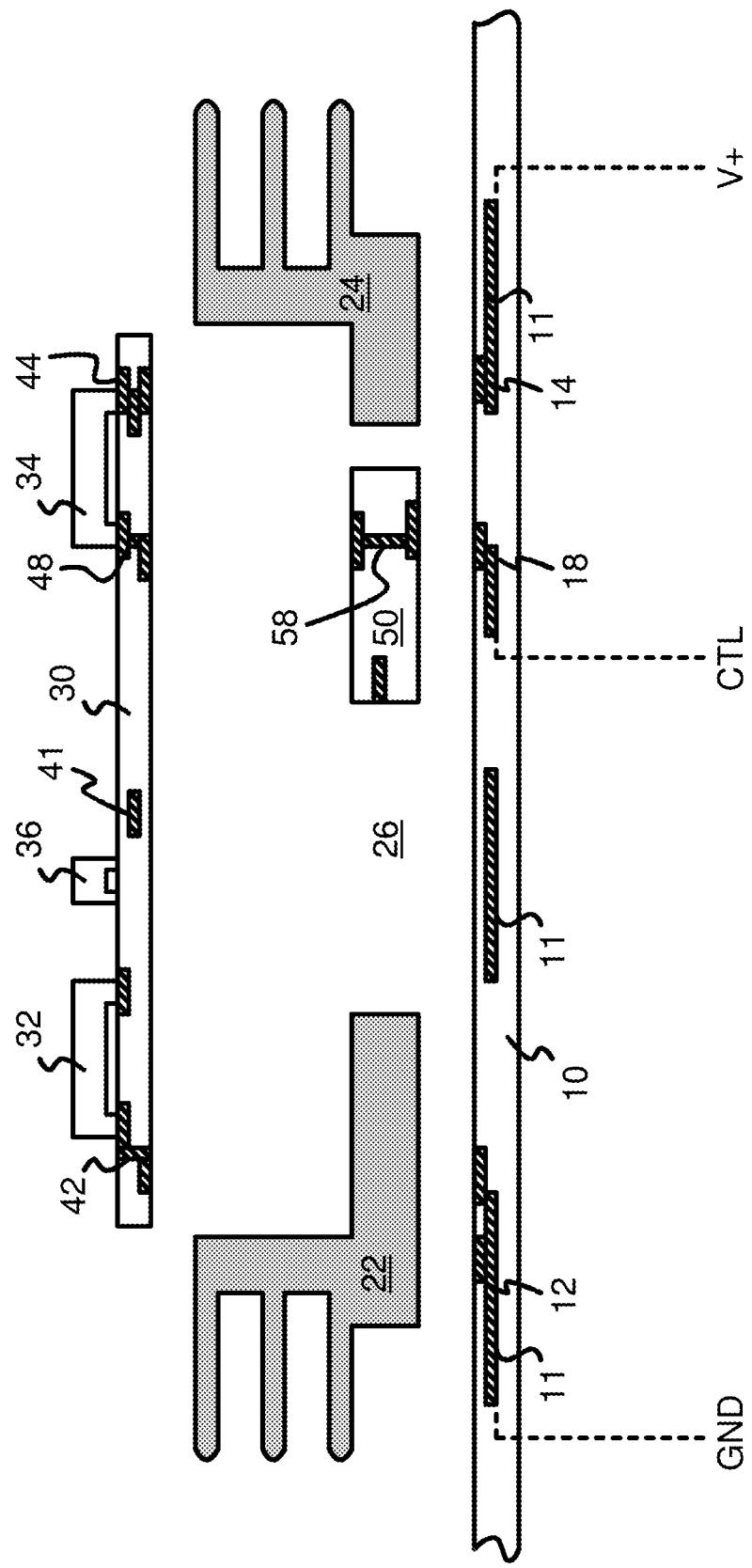
FIG. 5 is an exploded view of the power-converter module with interposer heat sinks highlighting the metal PCB traces.

FIG. 5 is an exploded view of the power-converter module with interposer heat sinks highlighting the metal PCB traces. Switching PCB 30 has metal layers 41 that are patterned into traces that are interconnected by metalized vias. Interconnect 42 connects to one or more ground terminals of IC package 32, such as metal leads, bent pins, or solder balls on the bottom of IC package 32. Interconnect 44 connects to one or more power terminals of IC package 34, such as metal leads, bent pins, or solder balls on the bottom of IC package 34. Interconnect 48 connects to a control terminal of IC package 34.

Interposer PCB 50 also has metal layers that are formed into metal traces with vias connecting the metal layers. Interconnect 58 is for connecting a control signal directly from switching PCB 30 to system PCB 10 without connecting to an interposer heat sink.

Likewise, system PCB 10 has metal layers 11 that form interconnect 12 for connecting to ground, interconnect 14 for connecting to input power V+(VIN+ FIG. 1), and interconnect 18 for connecting to control signals.

During assembly, interposer PCB 50 is placed in cavity 26 between interposer heat sinks 22, 24 and soldered to the bottom of switching PCB 30. Then the assembly of switching PCB 30, interposer heat sinks 22, 24, and interposer PCB 50 is attached and soldered to system PCB 10.

Figure 6:
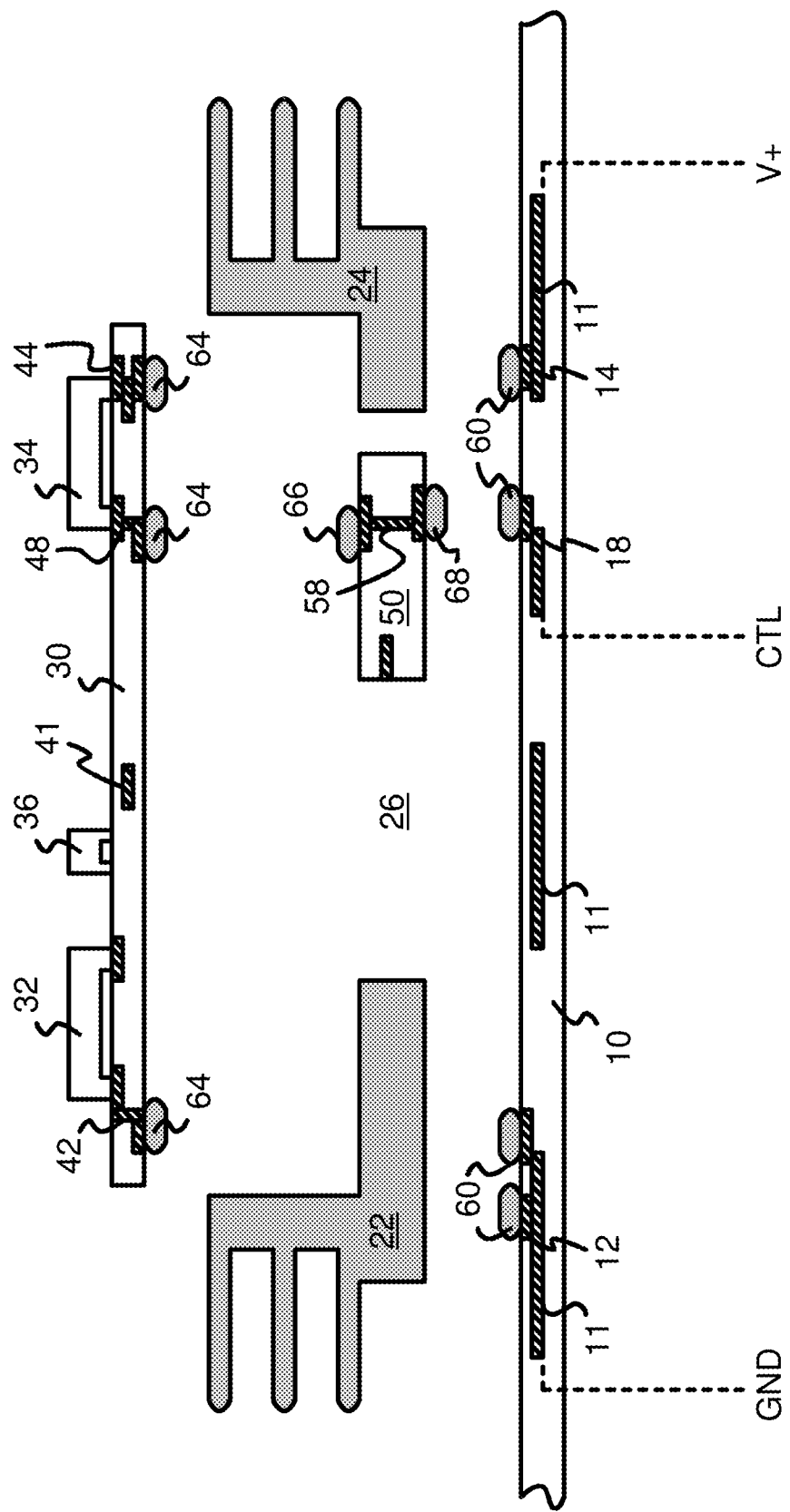
FIG. 6 is an exploded view of the power-converter module with interposer heat sinks highlighting soldering.

FIG. 6 is an exploded view of the power-converter module with interposer heat sinks highlighting soldering. During assembly, solder flux is applied to the bottom surface of switching PCB 30. When switching PCB 30 is placed over interposer heat sinks 22, 24 and interposer PCB 50 and heat is applied, the solder flux reflows and sticks to exposed metal, such as metal pads, to form solder balls 64 that connect to interposer heat sinks 22, 24 and interposer PCB 50. Solder flux may also be applied to the top surface of interposer PCB 50 to form solder balls 66 that melt into solder balls 64 during assembly.

Similarly, solder paste applied to the top surface of system PCB 10 form solder balls 60 when reheated and pressed into the bottom of interposer heat sinks 22, 24 and interposer PCB 50, which has solder balls 68. Solder flux also may be applied to surfaces of interposer heat sink 22. Interposer heat sink 22 may have solder pads formed on its surfaces, or areas textured for better solder adhesion.

Figure 7:
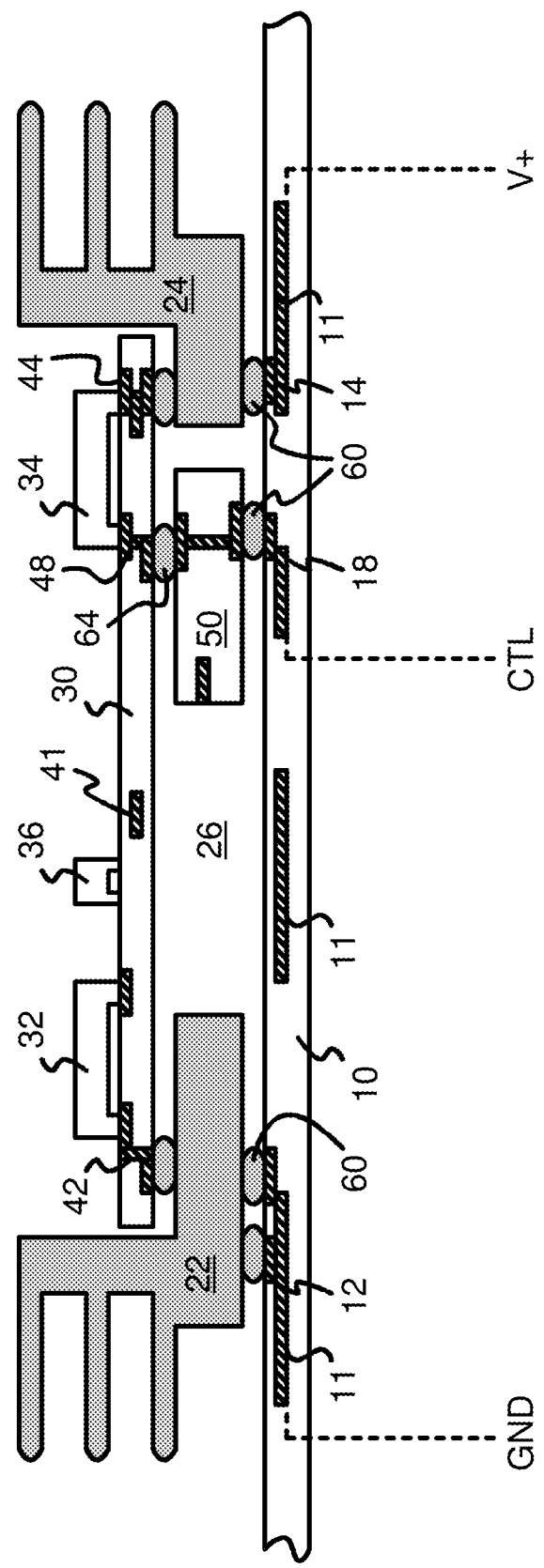
FIG. 7 is a side view of the final assembled power-converter module with interposer heat sinks highlighting soldering.

FIG. 7 is a side view of the final assembled power-converter module with interposer heat sinks highlighting soldering. Solder balls 60, 64 form solder joints after heating and reflow during assembly. Interconnect 42 is connected to the top of interposer heat sink 22 by solder balls 64, while solder balls 60 connect the bottom of interposer heat sink 22 to interconnect 12 to form a path to ground that also carries heat away from IC package 32 to be dissipated by the fins of interposer heat sink 22.

Similarly, interconnect 44 is connected to the top of interposer heat sink 24 by solder balls 64, while solder balls 60 connect the bottom of interposer heat sink 24 to interconnect 14 to form a path to the positive power supply that also carries heat away from IC package 34 to be dissipated by the fins of interposer heat sink 24.

Interconnect 48 connects to the top of interposer PCB 50 by solder balls 64, while solder balls 60 connect the bottom of interposer PCB 50 to interconnect 18 to form a path for control signals.

Figure 8:
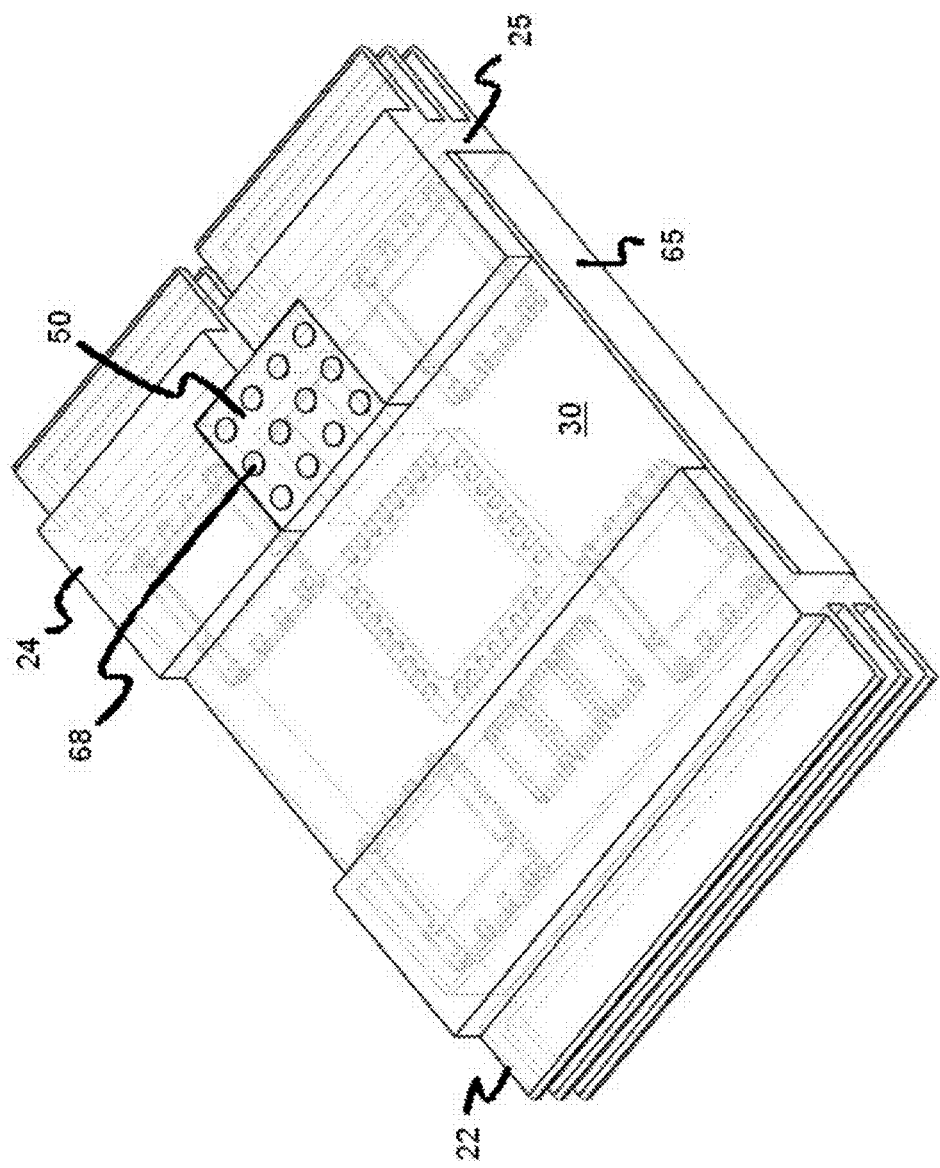
FIG. 8 is a bottom 3D view of the power-converter module with interposer heat sinks.

FIG. 8 is a bottom 3D view of the power-converter module with interposer heat sinks. The bottom of switching PCB 30 is facing upward. Interposer heat sinks 22, 24, 25 prevent switching PCB 30 from touching system PCB 10 that would be placed above interposer heat sinks 22, 24, 25 in this bottom 3D view.

Interposer heat sink 22 can carry the ground, while interposer heat sink 24 connects the input power supply VIN+ from system PCB 10 to switching PCB 30. Third interposer heat sink 25 can be used to connect the output power supply VOUT+ between system PCB 10 and switching PCB 30.

Interposer PCB 50 is fitted in the gap or cavity between interposer heat sinks 22, 24 in this variation. Interposer PCB 50 may carry several control signals, such as G1, G2, G3, G4 (FIG. 1), and status or other signals. An array of solder balls 68 on the bottom of interposer PCB 50 are used to connect to metal pads on the top surface of system PCB 10 (not shown). The bottom of interposer PCB 50 and the bottom of interposer heat sinks 22, 24, 25, facing upward in this 3D view, are flush so that all may be soldered to the top surface of system PCB 10.

Plastic housing 65 encloses the top of switching PCB 30 between interposer heat sinks 22, 24, 25. Plastic housing 65 protects IC packages 32, 34 and other components.

Figure 9:
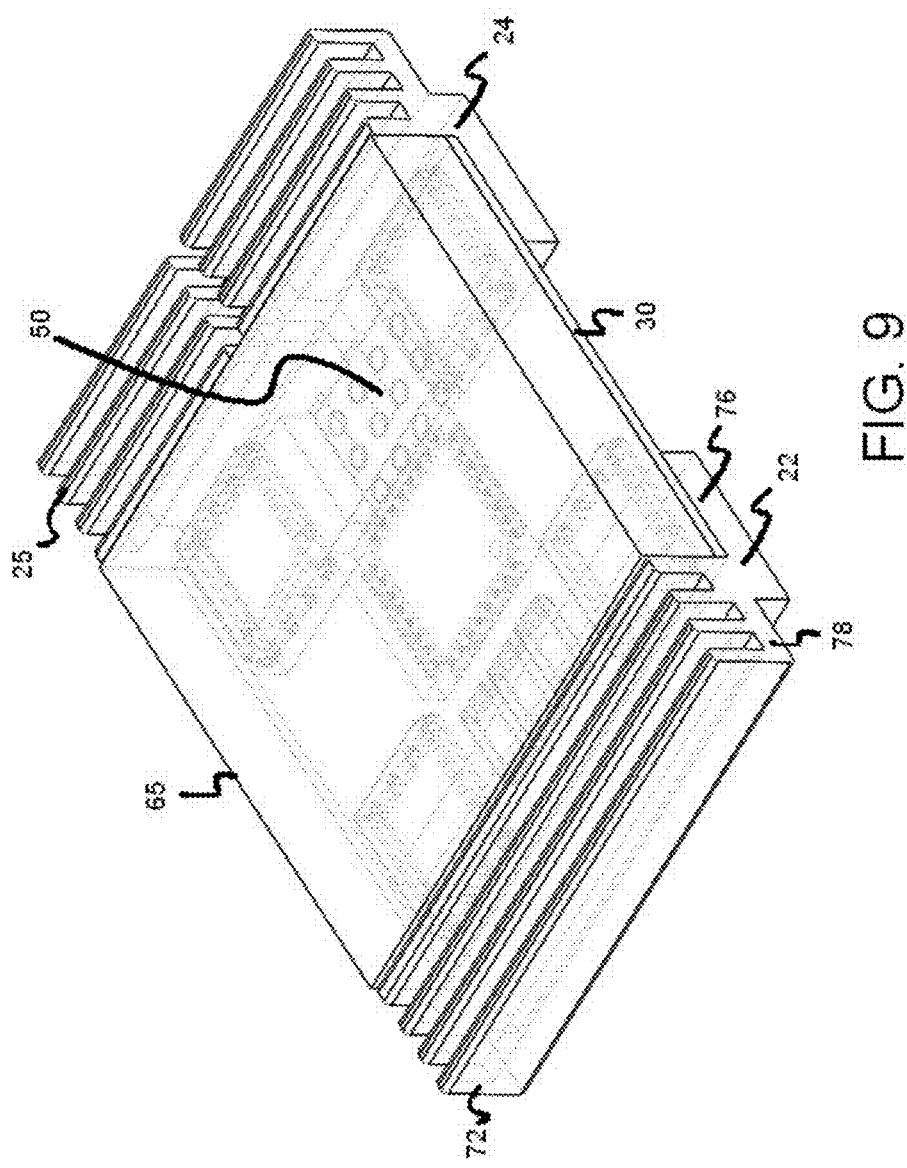
FIG. 9 is a top 3D view of the power-converter module with interposer heat sinks with vertical fins.

FIG. 9 is a top 3D view of the power-converter module with interposer heat sinks with vertical fins. The top of switching PCB 30 is facing upward. Interposer heat sinks 22, 24, 25 prevent switching PCB 30 from touching system PCB 10 that would be placed below interposer heat sinks 22, 24, 25 in this top 3D view. Interposer PCB 50 is soldered to the bottom of switching PCB 30 and is hidden from view.

In this embodiment, fins 72 of interposer heat sinks 22, 24, 25 are vertical rather than horizontal. Horizontal support 78 has vertical fins 72 extending upward from it, while interposer portion 76 is between switching PCB 30 and system PCB 10 (not shown) and carries electrical current between switching PCB 30 and system PCB 10. Plastic housing 65 covers the top of switching PCB 30 and IC packages 32, 34 and other components mounted to the top of switching PCB 30.

Figure 10:
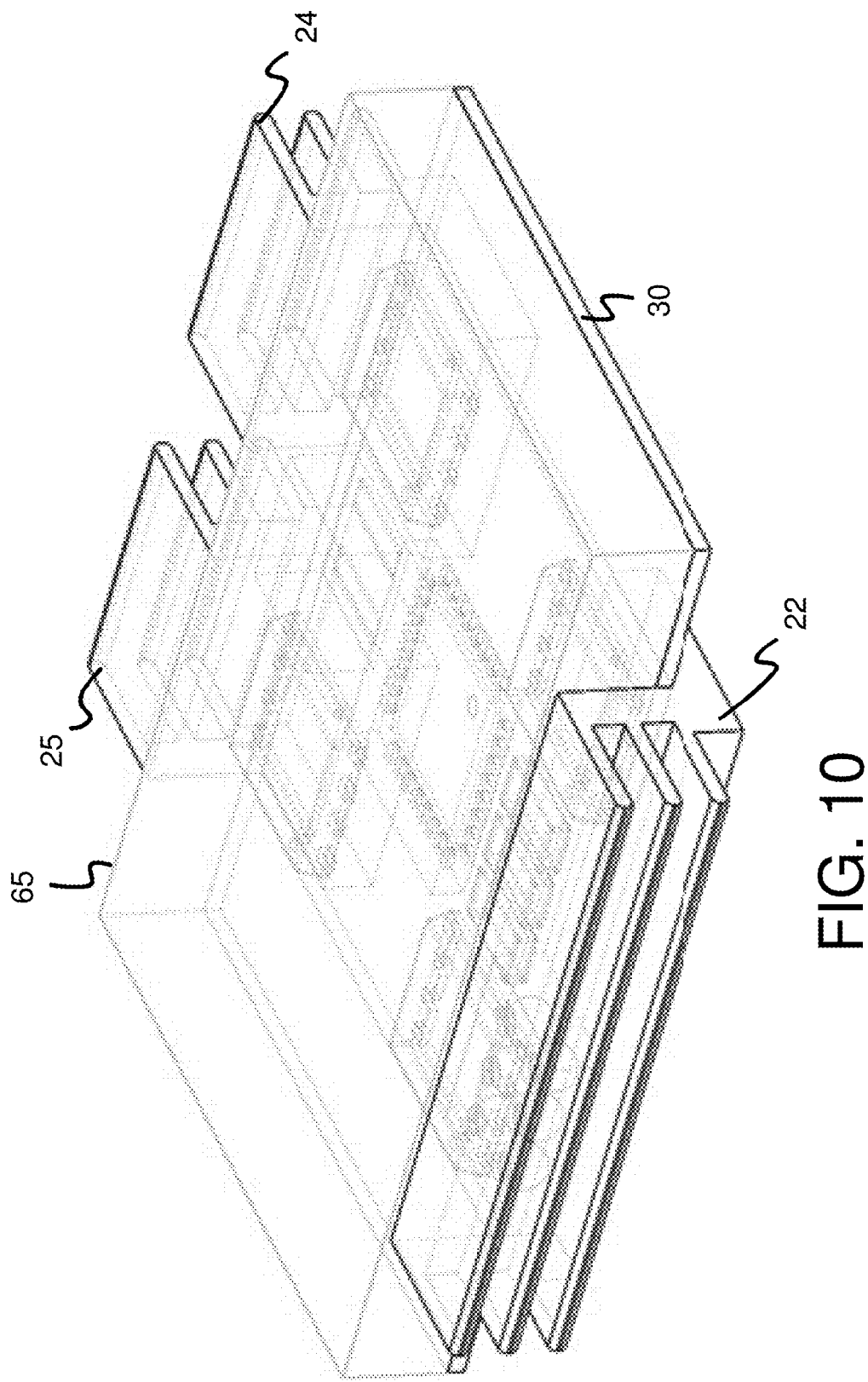
FIG. 10 is a top 3D view of the power-converter module with interposer heat sinks and a corner-placed switching PCB.

FIG. 10 is a top 3D view of the power-converter module with interposer heat sinks and a corner-placed switching PCB. Interposer heat sinks 22, 24, 25 have horizontal fins for cooling. In this variation, interposer PCB 50 (hidden from view underneath) is placed next to interposer heat sink 22 in a corner of switching PCB 30. In this variation, switching PCB 30 extends beyond interposer heat sinks 22, 24, 25.

Figure 11:
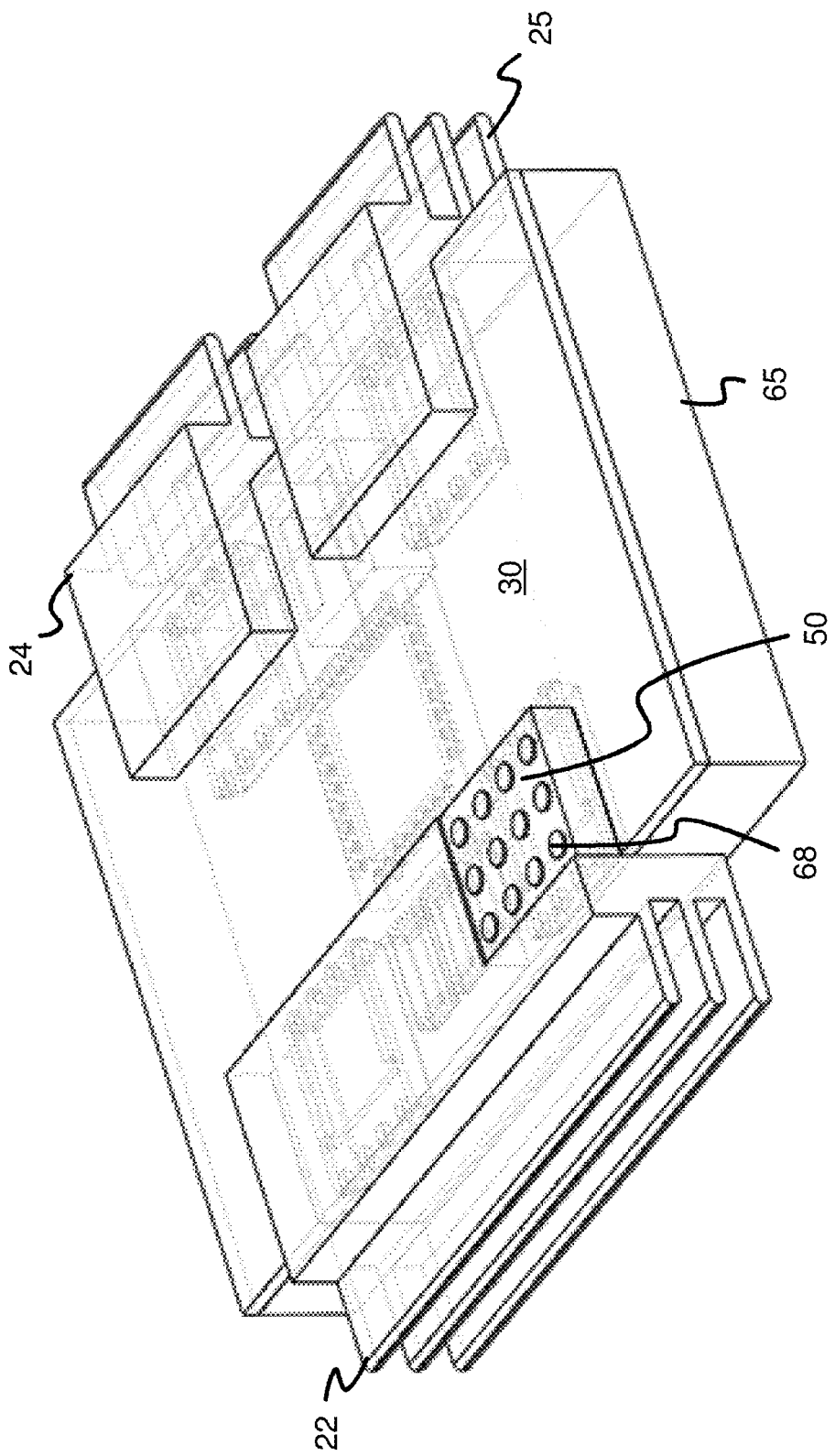
FIG. 11 is a bottom 3D view of the power-converter module with interposer heat sinks and the corner-placed switching PCB.

FIG. 11 is a bottom 3D view of the power-converter module with interposer heat sinks and the corner-placed switching PCB. Interposer PCB 50 is placed in a notch cutout of interposer heat sink 22, in a corner of switching PCB 30. Also in this variation, switching PCB 30 extends beyond interposer heat sinks 22, 24, 25.

An array of solder balls 68 on the bottom (facing upward in FIG. 11) of interposer PCB 50 are used to connect to metal pads on the top surface of system PCB 10 (not shown). The bottom of interposer PCB 50 and the bottom of interposer heat sinks 22, 24, 25, facing upward in this 3D view, are flush so that all may be soldered to the top surface of system PCB 10, simultaneously in a same assembly step.

ALTERNATE EMBODIMENTS

Several other embodiments are contemplated by the inventors. For example thermal vias may be added to switching PCB 30 or to system PCB 10 to assist with heat transfer through the PCBs. An array of thermal vias may be used. Other heat transfer and dissipation techniques may be used in combination with the power converter module with interposer heat sink 22. The transistors or inductors could be directly soldered onto heatsinks in a notch cutout of switching PCB 30.

There may be many control signals, each with its own interconnect 48, 58, 18. Status or other signals may be included in these control signals. When separate grounds are used for the input and output, a second interposer heat sink 22 may be used for the second ground. Interposer heat sink 22 may be split into 2 heat sinks, such as shown for interposer heat sinks 24, 25. Interposer heat sink 25 that connects to output power supply VOUT+ could instead connect to the left side of inductor 314 (FIG. 1), while another interposer heat sink could connect to the left side of inductor 312. This would provide better heat transfer since the thermal path is not through inductors 312, 314, but the interposer heat sinks are connected directly to the outputs of transistors 302-308. Additional heat sinks could be added. Additional heat sinks could be electrically isolated or electrically connected to other heat sinks.

Some power converters may have only transistors 302, 304 but not transistors 306, 308. Other variations of the power converter circuit are possible. Transistors 302-308 could each be packaged in a separate IC package 32, 34, or multiple transistors may be packaged in a single IC package 32. FIG. 1 is just one type of topology; other types of power converter topology could be substituted. Heatsinks could connect to inductor or transistor terminal nodes for additional thermal paths depending on the system requirements.

Other sensing and control components may be added to switching PCB 30, such as to measure currents or voltages for power control systems that might adjust the duty cycle of G1-G4, as one example.

More complex interposer heat sinks 22, 24, 25 are possible, with various complex shapes. Both horizontal and vertical fins could be used. Tabs or pads may be added to interposer heat sink 22 for making solder connections to switching PCB 30 and system PCB 10 on the top and bottom of interposer portion 76. Holes for screws and bolts may be added to interposer heat sinks 22, 24, 25 and to switching PCB 30. Cavity 26 may have various shapes and sizes. Interposer heat sinks 22, 24, 25 preferably are each an integrally formed structure, with fins and supports formed as one metal piece for better thermal conduction. For example, horizontal support 78, vertical fins 72, and interposer portion 76 all can be formed from the same copper metal, which promotes better thermal conduction from switching PCB 30. Having fins and interposer portion 76 as separate copper pieces that detach from each other, and perhaps are held together by screws or other fasteners, would have a lower thermal conduction and thus be inferior to a single integrated metal block for both fins and the interposer portion.

Interposer PCB 50 may be placed in several locations, such as in a notch cutout of interposer heat sink 22 (FIGS. 10-11). This notch cutout of interposer heat sink 22 does not have to be in the corner, but could be surrounded on 3 sides by interposer heat sink 22 rather than only 2 sides as shown in FIGS. 10-11. Interposer PCB 50 may also be placed between interposer heat sinks 24, 25 as shown in FIGS. 8-9, but could also be located in a notch cutout in a corner of either interposer heat sink 24 or of interposer heat sink 25. Interposer PCB 50 could also be placed between interposer heat sink 22 and interposer heat sink 24 in the middle of switching PCB 30 as shown in FIGS. 2-7. Many other placement of interposer PCB 50 are possible. Also, there may be more than one interposer PCB 50. Asymmetric or symmetric placement of interposer PCB 50 is possible.

Plastic housing 65 is optional and may be deleted, or another method of protection could be substituted. Since interposer heat sink 24 connects to input voltage VIN+, there is a danger of shorting if a person was to touch interposer heat sink 24 when the power converter is powered up. A larger chassis and housing for system PCB 10 can be used to block a person from touching interposer heat sink 24. Good system design can ensure that shorting of interposer heat sink 24 does not occur.

Inductors 312, 314 may be mounted to switching PCB 30 or may be separately placed off of switching PCB 30 with wires or cables for connecting the inductors to switching PCB 30. A larger load capacitor for capacitor 330 could also be external to switching PCB 30 and connected with a cable.

Since ground, input power, and output power supplies pass through interposer heat sinks 22, 24, 25, respectively, there is no need for ground and power to pass through interposer PCB 50. Nevertheless, power and ground could be routed through interposer PCB 50 in parallel to the paths through interposer heat sinks 22, 24, 25.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A thermal-enhanced module comprising:
a switching Printed Circuit Board (PCB);
a system PCB;
a semiconductor package having terminals soldered to pads on a top surface of the switching PCB;
a first interposer heat sink having cooling fins for dissipating heat and a first interposer portion having an upper surface that is soldered to metal pads on a lower surface of the switching PCB and having a bottom surface for soldering to metal pads on the system PCB;
a second interposer heat sink having cooling fins for dissipating heat and a second interposer portion having an upper surface that is soldered to metal pads on the lower surface of the switching PCB and having a bottom surface for soldering to metal pads on the system PCB;
an interposer PCB having an upper surface with upper pads that are soldered to metal pads on the lower surface of the switching PCB, and having a bottom surface with bottom pads for soldering to metal pads on the system PCB;
a first thermal and electrical path of metal from a first terminal of the semiconductor package, through metal traces and vias of the switching PCB, through a solder joint between the switching PCB and the first interposer heat sink, and to the system PCB through a solder joint between the first interposer heat sink and the system PCB; and
a second thermal and electrical path of metal from a second terminal of the semiconductor package, through metal traces and vias of the switching PCB, through a solder joint between the switching PCB and the second interposer heat sink, and to the system PCB through a solder joint between the second interposer heat sink and the system PCB;
wherein the bottom surface of the interposer PCB is flush with the bottom surface of the first interposer portion of the first interposer heat sink, and is also flush with the bottom surface of the second interposer portion of the second interposer heat sink;
wherein the top surface of a system PCB is able to be flush mounted and soldered to pads on the bottom surface of the interposer PCB, the bottom surface of the first interposer heat sink, and the bottom surface of the second interposer heat sink.

2. A thermal-enhanced power converter module comprising:
a switching Printed Circuit Board (PCB) having multiple layers of patterned metal;
a semiconductor package mounted on a top surface of the switching PCB;
a pull-down transistor inside the semiconductor package, the pull-down transistor having a gate controlled by a first control terminal of the semiconductor package and a source connected to a ground terminal of the semiconductor package;
a pull-up transistor inside the semiconductor package, the pull-up transistor having a gate controlled by a second control terminal of the semiconductor package and a source or drain connected to a power terminal of the semiconductor package;
metal pads on a lower surface of the switching PCB, the metal pads including a ground pad, a power pad, a first control pad, and a second control pad;
a ground interconnect, in the multiple layers of patterned metal in the switching PCB, the ground interconnect electrically and thermally connecting the ground terminal of the semiconductor package soldered to the top surface of the switching PCB to the ground pad on the lower surface;
a power interconnect, in the multiple layers of patterned metal in the switching PCB, the power interconnect electrically and thermally connecting the power terminal of the semiconductor package soldered to the top surface of the switching PCB to the power pad on the lower surface;
a first control interconnect, in the multiple layers of patterned metal in the switching PCB, the first control interconnect electrically connecting the first control terminal of the semiconductor package soldered to the top surface of the switching PCB to the first control pad on the lower surface;
a second control interconnect, in the multiple layers of patterned metal in the switching PCB, the second control interconnect electrically connecting the second control terminal of the semiconductor package soldered to the top surface of the switching PCB to the second control pad on the lower surface;
a first interposer heat sink having first cooling fins and having a first interposer portion having an upper surface soldered to the ground pad of the switching PCB, and having a bottom surface for soldering to a ground metal pad on a top surface of a system PCB;
wherein the first interposer heat sink carries ground currents from the switching PCB to the system PCB, and dissipates heat generated by the pull-down transistor using the first cooling fins;
a second interposer heat sink having second cooling fins and having a second interposer portion having an upper surface soldered to the power pad of the switching PCB, and having a bottom surface for soldering to a power metal pad on the top surface of the system PCB;
wherein the second interposer heat sink carries power currents from the system PCB to the switching PCB, and dissipates heat generated by the pull-up transistor using the second cooling fins;
an interposer PCB having multiple layers of patterned metal and an upper surface with an upper interposer first control pad that is soldered to the first control pad on the switching PCB and an upper interposer second control pad that is soldered to the second control pad on the switching PCB;

the interposer PCB also having a bottom surface with a bottom interposer first control pad and a bottom interposer second control pad; and interposer first control interconnect in the multiple layers of patterned metal in the interposer PCB, the interposer first control interconnect electrically connecting the upper interposer first control pad on the upper surface to the bottom interposer first control pad on the bottom surface;

wherein the bottom interposer first control pad is for soldering to a first control metal pad on the top surface of the system PCB;

wherein the bottom interposer second control pad is for soldering to a second control metal pad on the top surface of the system PCB.

3. The thermal-enhanced power converter module of claim 2 wherein the bottom surface of the interposer PCB is flush with the bottom surface of the first interposer portion of the first interposer heat sink, and is also flush with the bottom surface of the second interposer portion of the second interposer heat sink;

wherein the top surface of the system PCB is flush mounted and soldered to pads on the bottom surfaces of the interposer PCB, the first interposer heat sink, and the second interposer heat sink.

4. The thermal-enhanced power converter module of claim 2 wherein the first interposer portion of the first interposer heat sink, the second interposer portion of the second interposer heat sink, and the interposer PCB all have a same thickness between upper and bottom surfaces.

5. The thermal-enhanced power converter module of claim 3 wherein the switching PCB has a first edge and an opposing edge that is opposite of the first edge;

wherein the first interposer heat sink is fitted along the first edge, wherein the first cooling fins extend beyond the first edge;

wherein the second interposer heat sink is fitted along the opposing edge, wherein the second cooling fins extend beyond the opposing edge.

6. The thermal-enhanced power converter module of claim 5 wherein a cavity is formed between the first interposer portion and the second interposer portion and underneath the switching PCB;

wherein the interposer PCB is placed within the cavity.

7. The thermal-enhanced power converter module of claim 5 wherein the interposer PCB is located at least partially within a notch cutout of the first interposer portion or at least partially within a notch cutout of the second interposer portion.

8. The thermal-enhanced power converter module of claim 3 further comprising:

output power interconnect in the multiple layers of patterned metal in the switching PCB, the output power interconnect electrically and thermally connecting an output power node of the switching PCB to an output power pad on the lower surface;

wherein the pull-up transistor and the pull-down transistor switch current in response to the first control terminal and the second control terminal to generate output power on the output power node;

output power interconnect in the multiple layers of patterned metal in the switching PCB, the output power interconnect electrically and thermally connecting the output power node of the switching PCB to the output power pad on the lower surface;

a third interposer heat sink having third cooling fins and having a third interposer portion having an upper surface soldered to the output power pad of the switching PCB, and having a bottom surface for soldering to an output power metal pad on the top surface of the system PCB;

wherein the third interposer heat sink carries output power currents from the switching PCB to the system PCB, and dissipates heat generated by the pull-up transistor and the pull-down transistor using the third cooling fins.

9. The thermal-enhanced power converter module of claim 8 wherein the second interposer heat sink and the third interposer heat sink are located along a first edge of the switching PCB;

wherein the first interposer heat sink is located along an opposing edge of the switching PCB that is opposite of the first edge.

10. The thermal-enhanced power converter module of claim 3 wherein the first cooling fins and the second cooling fins are parallel to a plane of the switching PCB.

11. The thermal-enhanced power converter module of claim 3 wherein the first cooling fins and the second cooling fins are perpendicular to a plane of the switching PCB.

12. The thermal-enhanced power converter module of claim 3 wherein interconnect of the semiconductor package comprise package leads, solder balls, or package pins.

13. The thermal-enhanced power converter module of claim 3 wherein the semiconductor package comprises two packages, wherein a first semiconductor package comprises the pull-down transistor, the first control interconnect, and the ground interconnect, and wherein a second semiconductor package comprises the pull-up transistor, the second control interconnect, and the power interconnect.

14. A power-converter module comprising:

a switching Printed Circuit Board (PCB);

ground traces formed in the switching PCB, the ground traces having a first upper bonding pad and a first lower bonding pad that are connected together by metal traces and vias in the switching PCB;

input-power-supply traces formed in the switching PCB, the input-power-supply traces having a second upper bonding pad and a second lower bonding pad that are connected together by metal traces and vias in the switching PCB;

a first power transistor in a package mounted to the switching PCB, the first power transistor having a ground terminal electrically connected though a first package lead that is soldered to the first upper bonding pad;

a second power transistor in a package mounted to the switching PCB, the second power transistor having an input-power-supply terminal electrically connected though a second package lead that is soldered to the second upper bonding pad;

a first interposer heat sink having cooling fins and a first interposer portion;

a second interposer heat sink having cooling fins and a second interposer portion;

wherein the cooling fins are outside of a perimeter of the switching PCB;

wherein the first interposer portion and the second interposer portion are at least partially within the perimeter of the switching PCB;

wherein the first interposer portion has an upper surface that is soldered to the first lower bonding pad and a bottom surface for soldering to a bonding pad on a system PCB;

wherein the second interposer portion has an upper surface that is soldered to the second lower bonding pad and a bottom surface for soldering to a bonding pad on the system PCB;

an interposer PCB having a same thickness as a thickness of the first interposer portion and having a same thickness as a thickness of the second interposer portion; and control traces formed in the interposer PCB, the control traces each having a control upper bonding pad and a control bottom bonding pad that are connected together by metal traces and vias in the interposer PCB;

wherein the control bottom bonding pad is for soldering to a bonding pad on the system PCB;

wherein the control upper bonding pad on an upper surface of the interposer PCB is soldered to a lower bonding pad on a lower surface of the switching PCB.

15. The power-converter module of claim 14 wherein the control traces include control signals for controlling a gate of the first power transistor and for controlling a gate of the second power transistor.

16. The power-converter module of claim 14 wherein the system PCB has a larger perimeter than the perimeter of the switching PCB.

17. The power-converter module of claim 14 further comprising:

output-power-supply traces formed in the switching PCB, the output-power-supply traces having a third upper bonding pad and a third lower bonding pad that are connected together by metal traces and vias in the switching PCB;

a third interposer heat sink having cooling fins and a third interposer portion;

wherein the third interposer portion has an upper surface that is soldered to the third lower bonding pad and a bottom surface for soldering to a bonding pad on the system PCB.

18. The power-converter module of claim 17 wherein the third upper bonding pad is connected to a power output.

19. The power-converter module of claim 18 further comprising:

an inductor having a first terminal that is connected to outputs of the first power transistor and the second power transistor, the inductor also having a second terminal driving the power output.

20. The power-converter module of claim 14 wherein the first power transistor is in a first package and the second power transistor is in a second package.

\* \* \* \* \*